United States Patent [19]

Banaska

[11] Patent Number: 5,144,154
[45] Date of Patent: Sep. 1, 1992

[54] RANGE CHANGING USING N AND P CHANNEL FETS

[75] Inventor: John G. Banaska, Brunswick, Ohio

[73] Assignee: Keithley Instruments, Inc., Cleveland, Ohio

[21] Appl. No.: 526,291

[22] Filed: May 21, 1990

[51] Int. Cl.$^5$ .................... H03K 17/56; G01R 15/08
[52] U.S. Cl. .................... 307/242; 307/296.4; 307/296.5; 307/571; 324/99 R; 324/115
[58] Field of Search .............. 307/242, 296.4, 296.5, 307/571, 584, 585; 324/99, 115

[56] References Cited

U.S. PATENT DOCUMENTS

| | | | |
|---|---|---|---|
| 3,720,848 | 3/1973 | Schmidt, Jr. | 307/579 |
| 4,027,173 | 5/1977 | Nomiya et al. | 307/296.5 |
| 4,105,967 | 8/1978 | Macemon | 324/115 |
| 4,158,786 | 6/1979 | Harasawa | 307/270 |
| 4,337,517 | 6/1982 | Nickel et al. | 324/990 |
| 4,567,539 | 1/1986 | Sinberg | 307/296.4 |
| 4,611,135 | 9/1986 | Nakayama et al. | 307/585 |
| 4,929,848 | 5/1990 | Gulczynski | 307/296.4 |
| 4,994,774 | 2/1991 | Joosse | 307/520 |
| 5,010,261 | 4/1991 | Steigerwald | 307/584 |
| 5,065,057 | 11/1991 | Kawasaki | 307/296.4 |

FOREIGN PATENT DOCUMENTS

| | | | |
|---|---|---|---|
| 1463697 | 8/1969 | Fed. Rep. of Germany | 307/296.4 |
| 0219014 | 12/1984 | Japan | 307/296.4 |
| 1110094 | 4/1968 | United Kingdom | 307/296.4 |

OTHER PUBLICATIONS

Sedra et al., "Microelectric Circuits"; 1982; pp. 251-273.

*Primary Examiner*—Stanley D. Miller
*Assistant Examiner*—Terry D. Cunningham
*Attorney, Agent, or Firm*—Pearne, Gordon, McCoy & Granger

[57] ABSTRACT

A range selecting impedance is switched into or out of a parallel range-selecting network by connecting the impedance across the network through an n-channel and a p-channel FET connected in parallel output configuration. The n-channel FET does the switching if the drains are negative with respect to the sources. The p-channel FET does the switching if the drains are positive with respect to the sources. Each FET is controlled by a gate drive whose output waveform is varied to select the rate at which the FETs switch. In cases of several different switched range impedances, the FETs are used to switch the smallest impedance into the network, another range impedance is selected, and then the FETs used to switch the smallest impedance out of the network. In this way, fast glitch-free range switching is achieved.

8 Claims, 1 Drawing Sheet

RANGE CHANGING USING N AND P CHANNEL FETS

BACKGROUND OF THE INVENTION

The present invention relates to range changing in a measuring device, particularly to the switching of an impedance into or out of a parallel network of range impedances.

It is common to use a differential amplifier to drive a load at a particular voltage. The particular voltage to be maintained is connected to the noninverting input of the amplifier and the voltage developed across the load is fed to the inverting input of the amplifier. This feedback results in the voltage across the load being the same as the voltage at the noninverting input.

To measure current through the load, a resistor or other impedance, is added between the amplifier output and the load. The current to the load flows through this resistor resulting in a voltage across the resistor that corresponds to the load current. An appropriate voltage measuring device across the resistor then provides an indication of the load current.

Because of the feedback, the amplifier tries to maintain the load at the desired voltage independently of any voltage developed across the resistor.

In order to measure a wide range of currents, it is common to provide several different values of these current-sensing resistors, all switchable in parallel between the amplifier and the load, that is, between the two legs of a parallel range-selecting network.

As one of these resistors is switched into or out of this parallel range-selecting network using a relay or other mechanical switch, the voltage across the network changes. This often results in a sudden change in the voltage across the load. Because of the feedback, the output voltage quickly returns to the desired voltage. However, because the response time of the circuit is finite, a voltage spike will occur at the output.

It is possible to use an FET to switch the resistor into or out of the network by connecting the resistor in series with the drain and source of the FET across the network. A ramp voltage with respect to the source applied to the FET gate causes the switching to take place at a slower rate than a relay, resulting in less of a voltage spike or glitch at the output.

Unfortunately, the switching characteristics of the FET are substantially different depending on the polarity of the signal being switched.

For example, in the case of an n-channel FET, when the drain is positive with respect to the source, the FET very quickly turns on or off when the ramp is in the vicinity of the pinch-off voltage. On the other hand, when the drain is negative with respect to the source, the switching begins when the ramp is roughly at the pinch-off voltage plus the drain to source voltage and ends near zero volts (or vice versa). In this case, the FET output basically follows the ramp between zero and the pinch-off voltage plus the drain to source voltage. This polarity configuration can be described as operating the FET in follower mode.

Similarly, complementary results occur in the case of a p-channel FET.

It is of course desirable to prevent glitches when switching between any of the ranges. However, it significantly complicates the circuit design to provide an FET switch for each resistor in the network. This is particularly true in very low current applications where relays in addition to the FETs are required for proper isolation.

SUMMARY OF THE INVENTION

The present invention provides a circuit for switching a range-changing impedance into or out of a parallel range-selecting network.

The circuit includes an n-channel FET having a first gate, a first source and a first drain. The first source and drain are connected in series relationship with the impedance.

Also included is a p-channel FET having a second gate, a second source and a second drain. The second source and drain are connected in parallel relationship with the first source and drain.

Also included is a first drive circuit connected in series relationship with the first gate and adapted to control the n-channel FET when the first drain in negative with respect to the first source.

Also included is a second drive circuit connected in series relationship with the second gate and adapted to control the p-channel FET when the second drain is positive with respect to the second source.

The FETs switch the impedance into or out of the network in response to the drive circuits.

This configuration allows each FET to operate in its follower mode, the n-channel FET switching negative signals and the p-channel FET switching positive signals. Because the FETs are in the follower mode, the switching speed of either polarity signal can be precisely controlled by the signal from the drive circuits.

In the preferred embodiment, the drive circuits are adapted to switch the FETs from a conducting state to a non-conducting state at selectable rates. This allows the switching to take place at a speed tailored to the impedance being switched for maximum speed consistent with minimum glitch.

In an additional embodiment of the invention, the parallel range-changing network has several selectable impedances. The range switching takes place by configuring the smallest of the impedances as the impedance connecting to the network through the parallel FETs. Then to switch any of the impedances into the network, the smallest impedance is switched into the network with the FETs. Next, the desired impedance is switched into the network while the smallest impedance is switched into the network. Then the smallest impedance is switched out of the network with the FETs.

Using this method, only one set of FETs (and drive circuits) are needed. This results in the use of far less components.

The FET switched impedance provides the desired glitchless switching while the switching of the other impedances can be done by means such as a mechanical switch. Because the smallest impedance is across the network while the other impedances are switched, their switching has little, if any, effect on the circuit.

DESCRIPTION OF THE PREFERRED EMBODIMENTS

Figure 1:
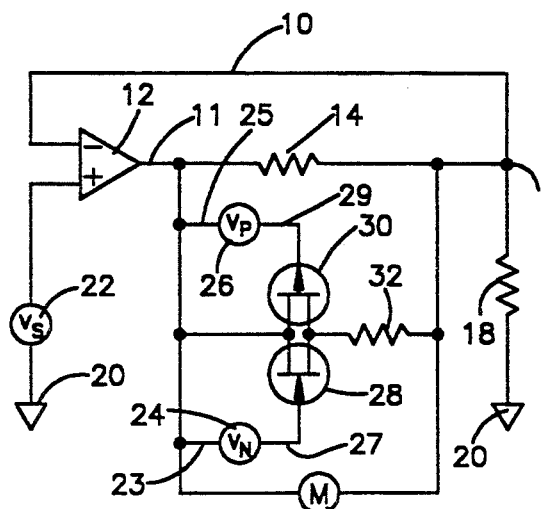
FIG. 1 is a schematic diagram of a circuit according to the invention.

Referring to FIG. 1, a circuit 10 according to the invention is shown. An amplifier output 11 of a differential amplifier 12 is connected through a resistor 14 to an output terminal 16. The amplifier 12 may be, for example one or more op-amps.

The output terminal 16 is also connected to the inverting input of the amplifier 12 and the first terminal of a load 18. The second terminal of the load 18 is connected to a common tie 20. The noninverting input of the amplifier 12 is connected to the first terminal of a voltage source 22. The second terminal of the voltage source 22 is connected to the common tie 20.

The amplifier output 11 is also connected to a first terminal 23 of a drive circuit 24 and a first terminal 25 of a drive circuit 26. The drive circuits 24, 26 are more fully described below.

A second terminal 27 of the drive circuit 24 is connected to the gate of an n-channel FET 28. A second terminal 29 of the drive circuit 26 is connected to the gate of a p-channel FET 30.

The amplifier output 11 is further connected to the sources of the FETs 28, 30. The drains of the FETs 28, 30 are connected through a resistor 32 to the output terminal 16.

A voltage measuring device 34 is connected between the output terminal 16 and the amplifier output 11. The voltage measuring device 34 may be, for example, a digital volt meter.

In operation, feedback from the output terminal 16 to the inverting input of the amplifier 12 results in the circuit 10 trying to maintain the voltage at the output terminal 16 at the voltage $V_s$ of the voltage source 22.

If the drive circuit 24 is supplying a negative voltage sufficient to turn off the FET 28 and the drive circuit 26 is supplying a positive voltage sufficient to turn off the FET 30, the resistor 32 is effectively switched out of the circuit. Then current flowing through the resistor 14 results in a voltage that is measured by the voltage measuring device 34. This voltage is directly related to the output current of the circuit 10 according to the resistance of the resistor 14.

In order to change the current measuring range of the voltage measuring device 34, it is desirable to change the impedance of the path between the amplifier output 11 and the output terminal 16 (e.g. lower resistance, lower voltage to measure).

The resistor 32 may be switched into the path between the amplifier output 11 and the output terminal 16 by switching on either or both of the FETs 28, 30. However, if the resistor 32 is switched into the circuit 10 too rapidly, a voltage spike, or glitch, may appear at the output terminal 16.

To allow careful control of switching the resistor 32 into or out of the circuit 10, the FETs 28, 30 are only operated in the follower mode. What this means is that the n-channel FET 28 is used to switch when the output terminal 16 is positive (and thus its drain is negative with respect to its source) and the p-channel FET 30 is used to switch when the output terminal 16 is negative (and thus its drain is positive with respect to its source).

To switch the resistor 32 into the circuit 10 using the n-channel FET 28, the drive circuit 24 starts at a voltage (e.g. $-15$ volts) below the pinch-off voltage plus the drain to source voltage and ramps toward zero. As the gate to source voltage rises above the sum of the pinch-off and drain to source voltages, the FET 28 begins to conduct. The drain to source voltage then linearly follows the drive circuit 24 to zero, the resistor 32 then being fully switched into the circuit 10.

To switch the resistor 32 out of the circuit 10 using the n-channel FET 28, the process is reversed, the drive circuit 24 starting at zero volts and ramping to a voltage below the pinch-off voltage plus the drain to source voltage.

In the case of the p-channel FET 30, the operation is similar except that the polarity of the signals are reversed.

Because the FETs 28, 30 follow the drive circuits 24, 26, respectively, it is possible to tailor the switching speed of the FETs 28, 30 as desired to eliminate glitches at the output terminal 16 when the current measuring range of the circuit is changed.

In the preferred embodiment, the drive circuits 24, 26 have two ramp speeds that may be selected to minimize glitches.

Figure 2:
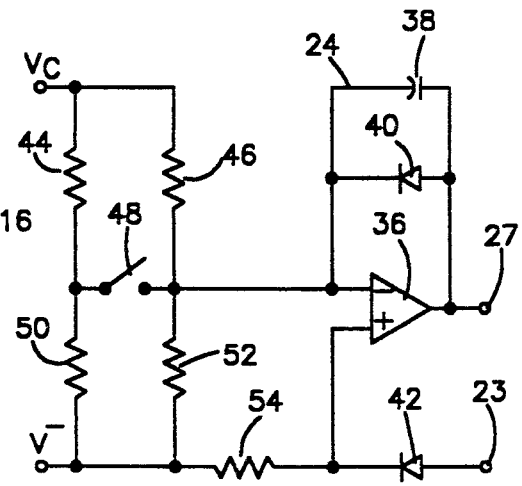
FIG. 2 is a schematic diagram of an n-channel FET drive circuit.

Referring to FIG. 2, an embodiment of the drive circuits 24 is shown schematically. A differential op-amp 36 has its output (the terminal 27) fed back through a capacitor 38 to its inverting input. A diode 40 is connected across the capacitor 38 with its cathode at the inverting input.

The noninverting input of the op-amp 36 is connected to the cathode of a diode 42. The anode of the diode 42 is connected to the terminal 23. A control voltage $V_c$ is connected to the first terminals of the resistors 44, 46. The second terminal of the resistor 44 is connected to the first terminal of a switch 48 and the first terminal of a resistor 50. The second terminal of the resistor 50 is connected to a negative voltage source $V^-$ and to the first terminals of the resistors 52, 54. The second terminal of the resistor 54 is connected to the noninverting input of the op-amp 36.

The second terminals of the switch 48 and the resistors 46, 52 are connected to the inverting input of the op-amp 36.

In operation, the drive circuit 24 provides a voltage across the terminals 27 and 23 either at $V^-$ (e.g. $-15$ volts) or zero volts, or is linearly ramping between the two, as controlled by one of two values of the voltage $V_c$ (e.g. 0 or 5 volts).

The values of the resistors 46, 52 (as well as the value of capacitor 38) determine the slope of the ramp. When the switch 48 is closed, the parallel combination of the resistors 44, 46, 50, 52 determine a different slope and thus a different switching speed or rate.

Figure 3:
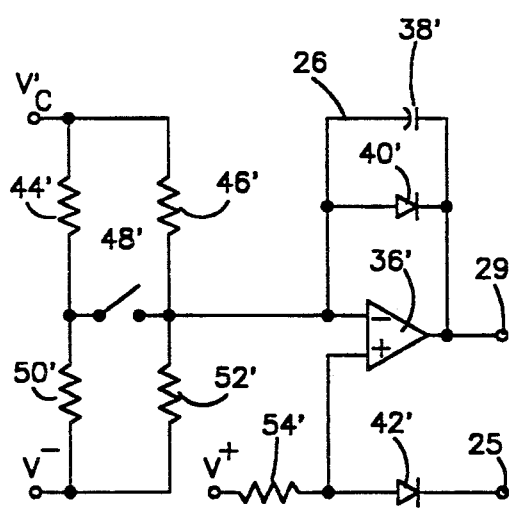
FIG. 3 is a schematic diagram of a p-channel FET drive circuit.

Referring to FIG. 3, an embodiment of the drive circuit 26 is shown schematically. A differential op-amp 36' has its output (the terminal 29) fed back through a capacitor 38' to its inverting input. A diode 40' is connected across the capacitor 38' with its anode at the inverting input.

The noninverting input of the op-amp 36' is connected to the anode of a diode 42'. The cathode of the diode 42' is connected to the terminal 25. A control voltage $V_c'$ is connected to the first terminals of the resistors 44', 46'. The second terminal of the resistor 44' is connected to the first terminal of a switch 48' and the first terminal of a resistor 50'. The second terminal of the resistor 50' is connected to the negative voltage source $V^-$ and to the first terminal of a resistor 52'. The first terminal of the resistor 54' is connected to a positive voltage source $V^+$ and the second terminal of the resistor 54' is connected to the noninverting input of the op-amp 36'.

The second terminals of the switch 48' and the resistors 46', 52' are connected to the inverting input of the op-amp 36'.

In operation, the drive circuit 26 provides a voltage across the terminals 29 and 25 that is either at V+ (e.g. 15 volts) or zero volts, or is linearly ramping between the two, as controlled by one of two values of the voltage $V_c'$ (e.g. 0 or 5 volts).

The values of the resistors 46', 52' (as well as the value of capacitor 38') determine the slope of the ramp. When the switch 48' is closed, the parallel combination of the resistors 44', 46', 50', 52' determine a different slope and thus a different switching speed or rate.

Figure 4:
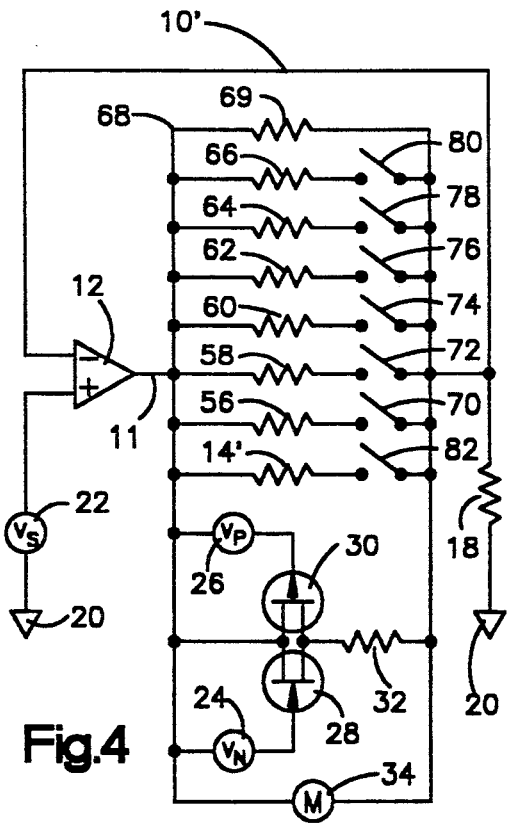
FIG. 4 is a schematic diagram of an additional embodiment of a circuit according to the invention.

Referring to FIG. 4, a circuit 10' according to the invention is shown. Components common to the previous embodiment bear the same reference numerals.

In this embodiment, additional range resistors 56, 58, 60, 62, 64, 66 are added to the parallel range-selecting network 68 through switches 70, 72, 74, 76, 78, 80, respectively. Also the range resistor 14' is switched into or out of the network 68 by a switch 82. In addition, a resistor 69 is always connected across the network 68.

The circuit 10' can be used to achieve the advantages of parallel FET switching without having to have parallel FETs and the necessary drive circuits for each branch of the network 68.

In the circuit 10', the resistor 32 is the smallest resistor of the network 68. It may be for example, 100 ohms and the other resistors 14', 56, 58, 60, 62, 64, 66, 69 may increase, for example, respectively, by tenfold each.

To select a range resistor other than the resistor 32 or the resistor 69, the resistor 32 is first switched into the network 68 by the FETs 28, 30 as described previously. Then one of the resistors 14', 56, 58, 60, 62, 64, 66 is switched into the network 68 by one of the switches 82, 70, 72, 74, 76, 78, 80, respectively. Finally, the resistor 32 is switched out of the network 68.

For the resistor 32, the resistor 32 is just left selected. For the resistor 69, none of the switches 70, 72, 74, 76, 78, 80, 82 are left closed when the resistor 32 is switched out of the circuit 10'.

In this way the controlled switching rate of the FETs 28, 30 can be used for all of the ranges. To ensure optimum performance, the ramp rates of the drive circuits 24, 26 can be varied depending on the range to be switched.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A circuit for switching a range-changing impedance having first and second terminals into or out of a parallel range-selecting network having first and second legs, said first terminal being connected to said first leg, said circuit comprising:

a voltage means connected between said legs, said voltage means providing a voltage to be ranged;

an n-channel FET having a gate, a source and a drain, said n-channel FET source being connected to said second leg and said n-channel FET drain being connected to said second terminal;

a p-channel FET having a gate, a source and a drain, said p-channel FET source being connected to said second leg and said p-channel FET drain being connected to said second terminal;

a first drive means connected between said n-channel FET gate and source for selectably turning on or off said n-channel FET when said n-channel FET drain is negative with respect to said n-channel FET source and turning said n-channel FET off otherwise; and a second drive means connected between said p-channel FET gate and source for selectably turning on or off said p-channel FET when said p-channel FET drain is positive with respect to said p-channel FET source and turning said p-channel FET off otherwise, wherein said FETs switch said impedance into or out of said network in response to said first and second drive means.

2. A circuit according to claim 1, wherein said first and second drive means switch said FETs from a conducting state to a non-conducting state at one of a selectable plurality of rates.

3. A method for switching a range-changing impedance having a first and second terminal into or out of a parallel range-selecting network having first and second legs, said method comprising:

providing a voltage to be ranged between said legs;

providing an n-channel and a p-channel FET, each having a source, a drain and a gate;

connecting the n-channel FET source and the p-channel FET source;

connecting the n-channel FET drain and the p-channel FET drain;

connecting said sources to said first leg;

connecting said first terminal to said drains;

connecting said second terminal to said second leg;

switching said impedance into or out of said network with said n-channel FET if the drain of the n-channel FET is negative with respect to the source of the n-channel FET; and switching said impedance into or out of said network with said p-channel FET if the drain of the p-channel FET is positive with respect to the source of the p-channel FET.

4. A method according to claim 3, wherein said switching steps are performed at a selectable rate.

5. A method for range changing in a parallel range-changing network having a first leg and a second leg and a plurality of selectable impedances, each impedance being connected between said first and second legs through a respective switch means, said each impedance being switched into said network when said respective switch means conducts and being switched out of said network when said respective switch means does not conduct, one impedance being the smallest, said method comprising:

providing a voltage to be ranged between said legs;

connecting an n-channel and a p-channel FET in source-to-source and drain-to-drain parallel relationship;

using said parallel FETs as said respective switch means for said smallest impedance;

switching said smallest impedance into said network with said n-channel FET if the drain of the n-channel FET is negative with respect to the source of the n-channel FET;

switching said smallest impedance into said network with said p-channel FET if the drain of the p-channel FET is positive with respect to the source of the p-channel FET;

switching a desired one of said plurality of selectable impedances into said network while said smallest impedance is switched into said network;

switching said smallest impedance out of said network with said n-channel FET after switching said desired impedance if the drain of the n-channel FET is negative with respect to the source of the n-channel FET; and switching said smallest impedance out of said network with said p-channel FET after switching said desired impedance if the drain of the p-channel FET is positive with respect to the source of the p-channel FET, thereby controlling switching transients in said network.

6. A method according to claim 5, wherein said switching steps with FETs are performed at a selectable rate.

7. A current measuring circuit comprising:

a differential amplifier having a noninverting input, an inverting input and an output;

a reference voltage source having a first and second terminal, the first terminal being connected to said amplifier noninverting input;

a first impedance having a first terminal connected to said amplifier output and a second terminal connected to said amplifier inverting input;

a load impedance having a first terminal connected to said first impedance second terminal and a second terminal connected to said reference voltage source second terminal;

a second impedance having a first and second terminal, said first terminal being connected to said first impedance second terminal;

an n-channel FET having a source connected to said amplifier output, a drain connected to said second impedance second terminal and a gate;

a p-channel FET having a source connected to said amplifier output, a drain connected to said second impedance second terminal and a gate;

a first drive means connected between said n-channel FET source and gate, said first drive means selectably turning on or off said n-channel FET when said load impedance first terminal is at a positive voltage with respect to said load impedance second terminal and turning said n-channel FET off otherwise;

a second drive means connected between said p-channel FET source and gate, said second drive means selectably turning on or off said p-channel FET when said load impedance first terminal is at a negative voltage with respect to said load impedance second terminal and turning said p-channel FET off otherwise;

a voltage measuring means connected between said amplifier output and said load impedance first terminal, said measuring means providing a measure of current between said amplifier output and said load impedance first terminal, wherein said FETs connect or disconnect said second impedance second terminal to said amplifier output in response to said first and second drive means thereby changing the current measuring range of said circuit.

8. A current measuring circuit according to claim 7, wherein said first and second drive means switch said FETs from a conducting state to a non-conducting state at one of a selectable plurality of rates.

* * * * *